(12) United States Patent
Chien

(10) Patent No.: US 7,015,586 B2
(45) Date of Patent: Mar. 21, 2006

(54) STACKED STRUCTURE OF INTEGRATED CIRCUITS

(75) Inventor: Potter Chien, Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 53 days.

(21) Appl. No.: 10/887,579

(22) Filed: Jul. 8, 2004

(65) Prior Publication Data

US 2006/0006549 A1 Jan. 12, 2006

(51) Int. Cl.
*H01L 23/48* (2006.01)

(52) U.S. Cl. ............... 257/777; 257/778; 257/782; 257/784; 257/786

(58) Field of Classification Search .............. None
See application file for complete search history.

(56) References Cited

U.S. PATENT DOCUMENTS 6,621,155 B1 * 9/2003 Perino et al. ............ 257/686
6,900,528 B1 * 5/2005 Mess et al. .............. 257/686

* cited by examiner

*Primary Examiner*—Long Pham
*Assistant Examiner*—Wai-Sing Louie
(74) *Attorney, Agent, or Firm*—Pro-Techtor Int'l Services

(57) ABSTRACT

A stacked structure of integrated circuits includes a substrate, a lower integrated circuit, a space layer, an upper integrated circuit, and a compound resin. The substrate has an upper surface on which a plurality of signal input terminals are formed at one side of the upper surface, and a lower surface. The lower integrated circuit has a plurality of bonding pads formed at the central region of the lower integrated circuit, which is mounted to the upper surface of the substrate and being electrically connected to the plurality of signal input terminals via a plurality of wires, so that at one side of the lower integrated circuit is formed with a space region without wires. The space layer is arranged on the space region of the lower integrated circuit. The upper integrated circuit is mounted to the space layer and electrically connected to the signal input terminals via a plurality of wires. The compound resin is located above the upper surface of the substrate for encapsulating the upper integrated circuit, lower integrated circuit, and the plurality of wires.

3 Claims, 2 Drawing Sheets

STACKED STRUCTURE OF INTEGRATED CIRCUITS

BACKGROUND OF THE INVENTION

1. Field of the Invention

The invention relates to a stacked structure of integrated circuits, and in particular to a stacked structure of integrated circuits having reduced manufacturing cost and a miniaturized package volume.

2. Description of the Related Art

In the current technological field, every product needs to be light, thin, and small. Therefore, it is preferable that the integrated circuit has a small volume in order to meet the demands of the products. In the prior art, even if the volumes of integrated circuits are small, they only can be electrically connected to the circuit board in parallel. Because the area of the circuit board is limited, it is not possible to increase the number of the integrated circuits mounted on the circuit board. Therefore, it is difficult to make the products small, thin, and light.

To meet the demands of manufacturing small, thin, and light products, a lot of integrated circuits can be stacked. However, when a lot of integrated circuits are stacked, the upper integrated circuit will contact and press the wires of the lower integrated circuit. In this case, the signal transmission to or from the lower integrated circuit is easily influenced.

Referring to FIG. 1, a conventional stacked structure of integrated circuits includes a substrate 10, a lower integrated circuit 12, an upper integrated circuit 14, a plurality of wires 16, and a spacer layer 18. The lower integrated circuit 12 is located on the substrate 10. The spacer layer 18 is located on the lower integrated circuit 12. The upper integrated circuit 14 is stacked on the spacer layer 18. That is, the upper integrated circuit 14 is stacked above the lower integrated circuit 12 with the spacer layer 18 interposed between the integrated circuits 12 and 14. Thus, a proper gap 20 is formed between the lower integrated circuit 12 and the upper integrated circuit 14. According to this structure, the plurality of wires 16 can be electrically connected to the edge of the lower integrated circuit 12. Furthermore, the plurality of wires 16 connecting the substrate 10 to the lower integrated circuit 12 are free from being pressed when the upper integrated circuit 14 is stacked above the lower integrated circuit 12.

Please referring to FIG. 2, is a schematic illustration showing an integrated circuit formed with pads in the central region of the integrated circuit. The pads 30 are formed on the central region of the integrated circuit 32. Wires 34 are electrically connected the pads 30 to the two sides of the substrate 36, therefore, the plurality of 34 is located above the integrated circuit 32, so that such integrated circuit 32 is not stacked.

SUMMARY OF THE INVENTION

An object of the invention is to provide a stacked structure of integrated circuits, which may be manufactured easily in low cost.

To achieve the above-mentioned objects, the invention provides a stacked structure of integrated circuits includes a substrate, which has an upper surface on which a plurality of signal input terminals are formed at one side of the upper surface, and a lower surface. A lower integrated circuit has a plurality of bonding pads formed at the central region of the lower integrated circuit, which is mounted to the upper surface of the substrate and being electrically connected to the plurality of signal input terminals via a plurality of wires, so that at one side of the lower integrated circuit is formed with a space region without wires. A space layer is arranged on the space region of the lower integrated circuit. An upper integrated circuit is mounted to the space layer and electrically connected to the signal input terminals via a plurality of wires. A compound resin is located above the upper surface of the substrate for encapsulating the upper integrated circuit, lower integrated circuit, and the plurality of wires.

DETAILED DESCRIPTION OF THE INVENTION

Figure 1:
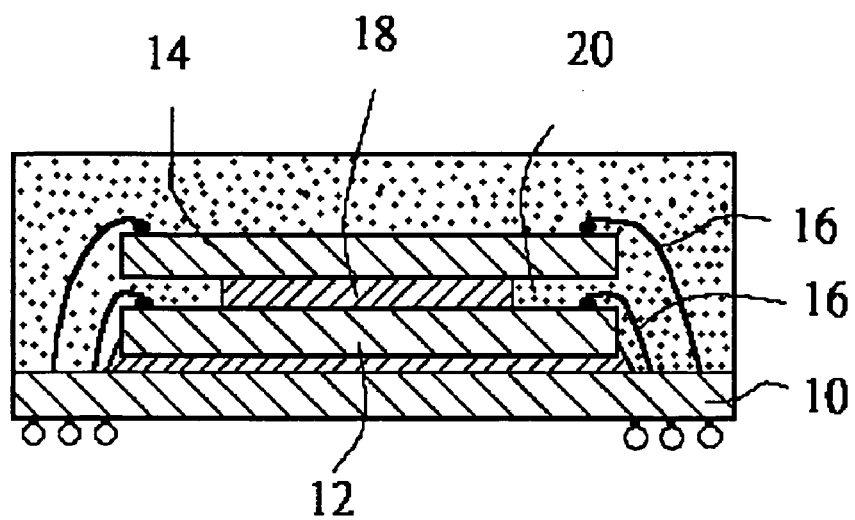
FIG. 1 is a cross-sectional view showing a conventional stacked structure of integrated circuits.
Figure 2:
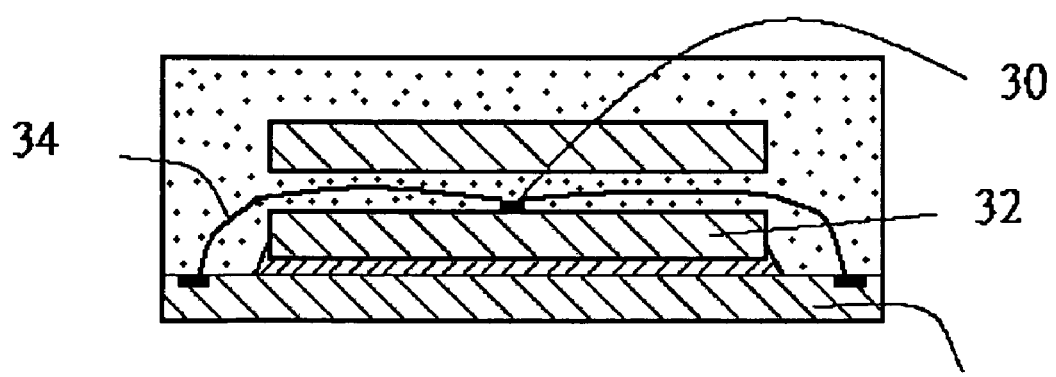
FIG. 2 is a schematic illustration view showing an integrated circuit having pads in the central region of the integrated circuit.
Figure 3:
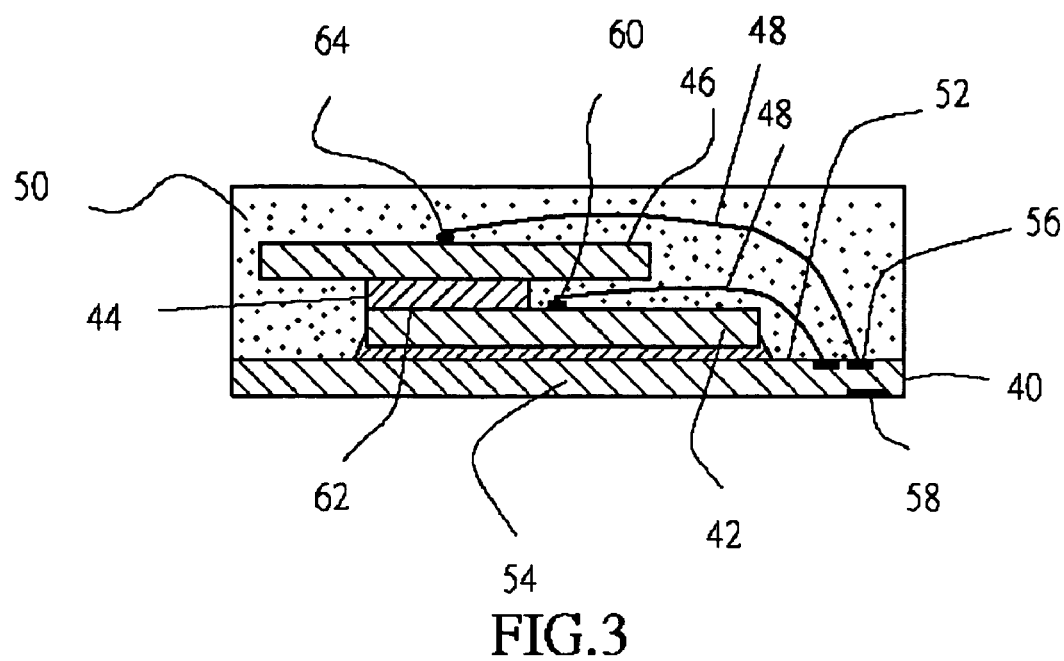
FIG. 3 is a cross-section view showing the stacked structure of integrated circuits of the invention.

Referring to FIG. 3, a stacked structure of integrated circuits of the invention includes a substrate 40, a lower integrated circuit 42, a space layer 44, an upper integrated circuit 46, wires 48, and a compound resin 50.

The substrate 40 has an upper surface 52 on which a plurality of signal input terminals 56 are formed at one side of the upper surface 52, and a lower surface 54 on which a plurality of signal output terminals 58 are formed.

The lower integrated circuit 42 has a plurality of bonding pads 60 formed at the central region of the lower integrated circuit 42, which is mounted to the upper surface 52 of the substrate 40 and is electrically connected to the plurality of signal input terminals 56 via a plurality of wires 48, so that at one side of the lower integrated circuit 42 is located formed with a space region 62 without wires 48.

The space layer 44 is silver glue, which is printed on the space region 62 of the lower integrated circuit 42.

The upper integrated circuit 46 is mounted to the space layer 44 and electrically connected to the signal input terminals 56 of the substrate 40 via the plurality of wires 48.

The compound resin 50 is located above the upper surface 52 of the substrate 40 for encapsulating the upper integrated circuit 42, lower integrated circuit 44, and the plurality of wires 48.

The structure of the invention has the following advantages.

Since the wires 48 is located on the one side of the lower integrated circuit 42, so that the lower integrated circuit 42 is formed with a space region 62, therefore, the upper integrated circuit 46 may be arranged on the space region 62, and can not damaged the wires 48. The structure of the invention may be stacked, and may be manufactured easily in low cost.

While the invention has been described by way of an example and in terms of a preferred embodiment, it is to be understood that the invention is not limited to the disclosed embodiment. To the contrary, it is intended to cover various modifications. Therefore, the scope of the appended claims should be accorded the broadest interpretation so as to encompass all such modifications.

What is claimed is:

1. A stacked structure of integrated circuits, comprising:
a substrate having an upper surface on which a plurality of signal input terminals are formed at one side of the upper surface, and a lower surface;
a lower integrated circuit having a plurality of bonding pads formed at the central region of the lower integrated circuit, which is mounted to the upper surface of the substrate and being electrically connected to the plurality of signal input terminals via a plurality of wires, so that at one side of the lower integrated circuit located formed with a space region without wires;
a space layer being arranged on the space region of the lower integrated circuit;
an upper integrated circuit mounted to the space layer and electrically connected to the signal input terminals via a plurality of wires; and
a compound resin located above the upper surface of the substrate for encapsulating the upper integrated circuit, lower integrated circuit, and the plurality of wires.

2. The stacked structure according to claim 1, wherein the lower surface of the substrate is formed with signal output terminals.

3. The stacked structure according to claim 1, wherein the space layer is silver glue.

* * * * *